(12) United States Patent
Gattere et al.

(10) Patent No.: US 10,501,310 B2
(45) Date of Patent: Dec. 10, 2019

(54) MICROELECTROMECHANICAL RESONATOR WITH IMPROVED ELECTRICAL FEATURES

(71) Applicant: STMicroelectronics S.r.l., Agrate Brianza (IT)

(72) Inventors: Gabriele Gattere, Castronno (IT); Alessandro Tocchio, Milan (IT); Carlo Valzasina, Gessate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 31 days.

(21) Appl. No.: 15/978,958

(22) Filed: May 14, 2018

(65) Prior Publication Data

US 2018/0339898 A1 Nov. 29, 2018

(30) Foreign Application Priority Data

May 25, 2017 (IT) .......................... 102017000057086

(51) Int. Cl.
*B81B 3/00* (2006.01)
*H03H 9/24* (2006.01)
(Continued)

(52) U.S. Cl.
CPC .......... *B81B 3/0081* (2013.01); *B81B 3/0021* (2013.01); *B81B 7/008* (2013.01); *B81B 7/0019* (2013.01); *B81B 7/0022* (2013.01); *B81B 7/0087* (2013.01); *H03H 9/02244* (2013.01); *H03H 9/02338* (2013.01);
(Continued)

(58) Field of Classification Search
USPC .................................................... 331/29, 154
See application file for complete search history.

(56) References Cited

U.S. PATENT DOCUMENTS

2009/0140443 A1\* 6/2009 Hohlfeld ................. H02N 1/08
257/786
2011/0127621 A1 6/2011 Kimura et al.
(Continued)

OTHER PUBLICATIONS

Hoperoft, "Temperature-Stabilized Silicon Resonators for Frequency References," Dissertation, Stanford University, Sep. 2007, 253 pages.

*Primary Examiner* — Joseph Chang
(74) *Attorney, Agent, or Firm* — Seed IP Law Group LLP

(57) ABSTRACT

A MEMS resonator is equipped with a substrate, a moving structure suspended above the substrate in a horizontal plane formed by first and second axes, having first and second arms, parallel to one another and extending along the second axis, coupled at their respective ends by first and second transverse joining elements, forming an internal window. A first electrode structure is positioned outside the window and capacitively coupled to the moving structure. A second electrode structure is positioned inside the window. One of the first and second electrode structures causes an oscillatory movement of the flexing arms in opposite directions along the first horizontal axis at a resonance frequency, and the other electrode structure has a function of detecting the oscillation. A suspension structure has a suspension arm in the window. An attachment arrangement is coupled to the suspension element centrally in the window, near the second electrode structure.

20 Claims, 6 Drawing Sheets

(51) Int. Cl.
 *B81B 7/00* (2006.01)
 *H03H 9/02* (2006.01)
(52) U.S. Cl.
 CPC ... *H03H 9/2431* (2013.01); *H03H 2009/0244* (2013.01); *H03H 2009/0248* (2013.01)

(56) References Cited

U.S. PATENT DOCUMENTS

| | | |
|---|---|---|
| 2012/0262026 A1 | 10/2012 | Lin et al. |
| 2014/0252509 A1 | 9/2014 | Merassi |
| 2016/0169931 A1 | 6/2016 | Tocchio |
| 2017/0108530 A1 | 4/2017 | Tocchio et al. |

\* cited by examiner

MICROELECTROMECHANICAL RESONATOR WITH IMPROVED ELECTRICAL FEATURES

BACKGROUND

Technical Field

The present disclosure relates to a microelectromechanical resonator, known as a MEMS resonator ("MicroElectro-Mechanical Structure"), having improved electrical features, particularly as regards the frequency stability and external interference rejection.

Description of the Related Art

The MEMS resonator may, for example, be advantageously used for real time clock (RTC) applications, which are referred to in the following description without loss of generality.

In a known way, RTC devices are commonly used as clocks in portable and other electronic devices, such as mobile telephones, video cameras or still cameras, automotive devices, domestic appliances, data acquisition terminals, smart card readers, and the like, for the purpose of counting the passage of real time (in years, months, days, hours, minutes and seconds), even when the electronic devices concerned are switched off.

For this purpose, an RTC device usually includes an oscillator circuit having a suitable resonant structure, also simply called a "resonator", capable of generating an operating (or resonance) frequency, which for example is equal to 32.768 kHz, or a multiple thereof. A processing circuit is coupled to the oscillator circuit for counting the passage of time on the basis of this operating frequency, and a suitable power source supplies electrical power to the device.

Although quartz technology has dominated the field of frequency generation (including real time clock applications) for several decades, silicon-based MEMS resonators have recently been proposed and are becoming increasingly successful.

The advantages of using MEMS resonators include, above all, substantial containment of size and considerable reduction in cost, owing to the possibility of producing MEMS resonators by standard integrated circuit manufacturing processes, and the possibility of integrating at low cost, in a single chip of semiconductor material, both the mechanical structure and the corresponding electronic circuit (in the form of an ASIC, i.e., an application specific integrated circuit). MEMS resonators are also usually more resistant to impact and mechanical stresses, and have a lower power consumption than conventional quartz-based designs.

MEMS resonators include micromechanical structures made by micromachining techniques, which are caused to vibrate at their natural resonance frequency as a result of external stimuli in the form of suitable DC (continuous) electrical bias and AC (alternating) actuation signals. These micromechanical structures typically comprise at least one moving mass attached to a substrate by suitable mechanical fastening elements, this mass being made to resonate by the bias and actuation signals applied. The moving mass, together with a fixed electrode structure coupled to it, forms a capacitor, and the resonant vibration of the moving mass causes a variation in the capacitance of this capacitor, which is converted into an output signal at the desired operating frequency.

FIG. 1 shows schematically a known MEMS resonator structure, indicated in a general way by 1, of what is known as the DEFT (Double-Ended Tuning Fork) type; this MEMS resonator 1 is described, for example, in "Temperature-stabilized silicon resonators for frequency references", Matthew A. Hoperoft, PhD Dissertation, September 2007, Stanford University.

The MEMS resonator 1 includes a resonant moving structure 2, having its main extension in a horizontal plane xy, formed by a first and a second horizontal axis x, y, orthogonal to one another, and a negligible extension, or in any case a much smaller extension, along a vertical axis z which is orthogonal to the aforesaid horizontal plane xy.

The resonant moving structure 2 is composed of a first and a second arm (or "beam") 2a, 2b, parallel to one another, with a longitudinal main extension, along the second horizontal axis y in the example.

The resonant moving structure 2 is positioned in suspension above a substrate 3, parallel to an upper surface of the substrate 3.

The first and second arms 2a, 2b are joined at their first ends by a first transverse joining element 4a, having an extension along the first horizontal axis x which is smaller than the longitudinal extension of the first and second arms 2a, 2b, and at their second ends by a second transverse joining element 4b, which also has an extension along the first horizontal axis x. Each arm 2a, 2b thus forms a "clamped-clamped" system, which is fastened at both ends.

The resonant moving structure 2 forms a window 5, which has a substantially rectangular shape in the horizontal plane xy, within itself.

The resonant moving structure 2 is attached to the substrate 3 by a single attachment 6, which for example consists of a pillar or column element extending along the vertical axis z as far as the substrate 3. In particular, the first transverse joining element 4a is connected to the aforesaid attachment 6 by a connecting element 7. The attachment 6 is positioned centrally relative to the resonant moving structure 2, and outside the window 5.

The MEMS resonator 1 further includes a first and a second outer electrode 8a, 8b, positioned facing and parallel to the first and second arm 2a, 2b, respectively, of the resonant moving structure 2, outside the resonant moving structure 2 and the window 5 (the electrodes having one of the functions of actuation and detection); and an inner electrode 9 is positioned inside the window 5, and in turn is positioned facing and parallel to the first and second arm 2a, 2b of the resonant moving structure 2, inside the resonant moving structure 2 (this electrode having one of the functions of actuation and detection other than the one that the outer electrodes 8a, 8b have).

The first and second outer electrode 8a, 8b and the inner electrode 9 are attached to the substrate 3 of the MEMS resonator 1, being for example coupled in a fixed way to the upper surface of the substrate 3 by respective attachments, each of which is, for example, shaped as a column or pillar of semiconductor material, positioned for example in a central position relative to their extension in the horizontal plane xy.

In use, the application of suitable actuation voltages between the outer electrodes 8a, 8b and the resonant moving structure 2 (or between the inner electrode 9 and the same resonant moving structure 2) causes a movement of deformation by flexion of the corresponding first and second arm 2a, 2b in opposite directions along the first horizontal axis x, at the resonance frequency (the actuation therefore excites the antiphase vibration mode of the arms 2a, 2b of the moving structure 2).

The consequent movement towards and away from the detection electrodes (the inner electrode 9 or the outer electrodes 8a, 8b, according to their function) causes a variation of the capacitive coupling and the generation of an associated electrical signal, also at the resonance frequency, which may then be detected and processed in a suitable way by an electronic circuit associated with the MEMS resonator 1.

Advantageously, the detection of the antiphase oscillation condition makes it possible to cancel out the effect of external acceleration due to interference acting on the microelectromechanical structure.

However, the present applicant has found that the MEMS resonator 1 described above is not entirely optimized in terms of its electrical performance.

In particular, the MEMS resonator 1 of FIG. 1 has low rejection of external stresses, for example those due to variations of temperature or humidity, which may cause deformation or bending of the substrate 3 of the MEMS resonator 1, as shown schematically in FIG. 2.

The present applicant has found that this characteristic is due to the fact that the fixed, or stator, electrodes (that is to say, the aforesaid first and second outer electrodes 8a, 8b and the inner electrode 9) are attached at a considerable distance from the attachment 6 of the resonant moving structure 2 (the arms 2a, 2b of which form the moving, or rotor, electrodes of the MEMS resonator 1).

Therefore, a deformation of the substrate 3, for example the bending of the corresponding upper surface (see the aforesaid FIG. 2), may cause a variation, which may be considerable, of the facing distance d (known as the "gap") at rest between the aforesaid fixed and moving electrodes, and it is known that the value of the resonance frequency also depends on the value of the aforesaid gap between the fixed and moving electrodes.

The present applicant has also found that the MEMS resonator 1 of FIG. 1 has a non-optimized quality factor Q, resulting in higher electricity consumption, owing to the presence of energy dissipation towards the substrate 3.

In particular, at the single attachment 6, to which both arms 2a, 2b of the resonant moving structure 2 are directly coupled, there is dissipation towards the substrate 3 of the elastic waves generated by the resonant movement.

The solutions that have been proposed hitherto for producing silicon MEMS resonators have therefore not proved entirely satisfactory.

BRIEF SUMMARY

Embodiments of the present disclosure provide a MEMS resonator having improved mechanical and electrical features, particularly as regards the stability of the resonance frequency and the corresponding power consumption.

BRIEF DESCRIPTION OF THE SEVERAL VIEWS OF THE DRAWINGS

To enable the present disclosure to be understood more readily, preferred embodiments of it will now be described, purely by way of non-limiting example, with reference to the attached drawings, in which.

DETAILED DESCRIPTION

Figure 1:
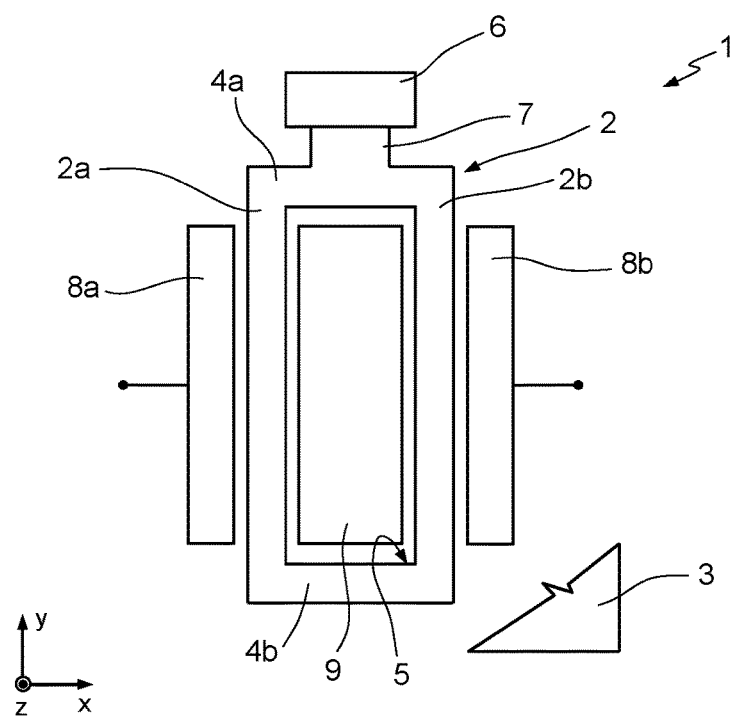
FIG. 1 is a schematic representation, in a top view, of a known type of MEMS resonator.
Figure 2:
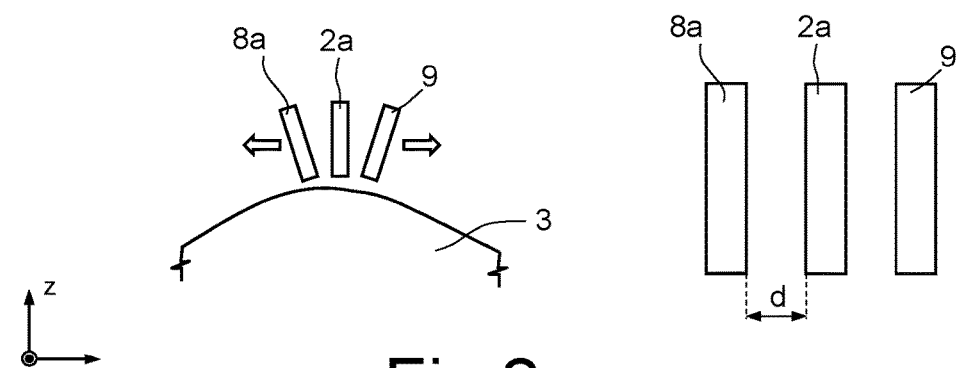
FIG. 2 is a schematic representation, in cross section, of a portion of the MEMS resonator of FIG. 1, in the presence of deformation of the corresponding substrate.
Figure 3:
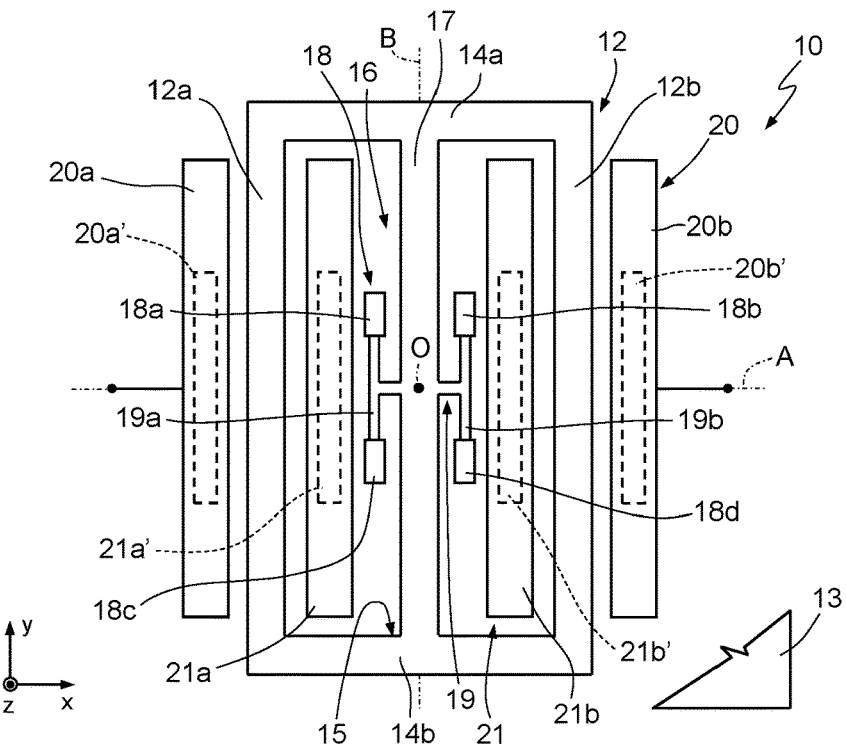
FIG. 3 is a schematic representation, in a top view, of a MEMS resonator according to a first embodiment of the present solution.

As shown in FIG. 3, according to an embodiment of the present solution, a MEMS resonator 10 comprises a resonant moving structure 12, having its main extension in a horizontal plane xy, formed by a first and a second horizontal axis x, y, orthogonal to one another, and a smaller extension along a vertical axis z which is orthogonal to the aforesaid horizontal plane xy.

The resonant moving structure 12 is composed of a first and a second flexing arm 12a, 12b, parallel to one another, with a longitudinal main extension, along the second horizontal axis y in the example.

The resonant moving structure 12 is positioned in suspension above a substrate 13 of the MEMS resonator 10, parallel to an upper surface of the substrate 13.

The first and second flexing arms 12a, 12b are joined at their first ends by a first transverse joining element 14a, having an extension along the first horizontal axis x, and at their second ends by a second transverse joining element 14b, which also has an extension along the first horizontal axis x.

The resonant moving structure 2 thus forms a window 15, having a substantially rectangular shape in the horizontal plane xy, within itself. In particular, the shape factor of the structure is such that this window 15 is considerably elongated along the second horizontal axis y, as compared with the first horizontal axis x. The length of the flexing arms 12a, 12b is, for example, three or four times the length of the transverse joining elements 14a, 14b.

The resonant moving structure 12 is suspended above the substrate 13 by a suspension structure 16, comprising a suspension arm 17 positioned centrally in the window 15, extending along the second horizontal axis y in the example, parallel to the first and second flexing arms 12a, 12b, from a central portion of the first transverse joining element 14*a* to a corresponding central portion of the second transverse joining element 14*b*.

A geometric center O of a central portion of the aforesaid suspension arm 17 corresponds to the geometric center of the structure of the MEMS resonator 10 in the horizontal plane xy.

The suspension structure 16 further includes an attachment arrangement 18 consisting of a number (greater than or equal to one) of attachments, arranged in the window 15 and integral with the substrate 13, to which the suspension arm 17 is integrally connected. The suspension structure 16 may also include a respective number of connecting elements 19, also arranged in the window 15 and capable of integrally connecting the suspension arm 17 to the attachments of the attachment arrangement 18.

In the embodiment shown in the aforesaid FIG. 3, the aforesaid attachment arrangement 18 includes a first, a second, a third and a fourth attachment 18*a*-18*d*, consisting for example of respective pillar or column elements extending along the vertical axis z to reach the substrate 13.

The suspension structure 16 further includes, in the embodiment shown in FIG. 3, a first and a second T-shaped connecting element 19*a*, 19*b*, each having a shank portion extending along the first horizontal axis x, connected to the central portion of the suspension arm 17, and a head portion, extending along the second horizontal axis y, transversely to the shank portion, and connected at opposing head ends to a respective pair of attachments.

In particular, the head portion of the first connecting element 19*a* is connected to a first and a third attachment 18*a*, 18*c* forming a first pair of attachments, and the head portion of the second connecting element 19*b* is connected to a second and a fourth attachment 18*b*, 18*d* forming a second pair of attachments of the attachment arrangement 18.

The aforesaid shank portions of the first and second connecting elements 19*a*, 19*b* extend parallel to the first horizontal axis x, along a first axis of symmetry A of the MEMS resonator 10 in the horizontal plane xy, which passes through the geometric center O, and the aforesaid head portions of the first and second connecting elements 19*a*, 19*b* extend parallel to the second horizontal axis y, parallel to, and at the same distance from, a second axis of symmetry B of the MEMS resonator 10, which passes through the geometric center O and runs along the second horizontal axis y.

Consequently, the attachments 18*a*-18*d* are arranged on opposite sides of, and at the same distance from, the aforesaid first axis of symmetry A and the aforesaid second axis of symmetry B, while also being symmetrical about the geometric center O in the illustrated embodiment.

The MEMS resonator 10 further includes a first electrode structure 20, coupled capacitively in the horizontal plane xy to the resonant moving structure 12, including, in the illustrated embodiment, a first and a second outer electrode 20*a*, 20*b*, arranged facing and parallel to the first and second flexing arm 12*a*, 12*b* respectively, outside the resonant moving structure 12 and the window 15. A second electrode structure 21 is also coupled capacitively in the horizontal plane xy to the resonant moving structure 12, comprising, in the illustrated embodiment, a first and a second inner electrode 21*a*, 21*b* arranged inside the window 15, facing and parallel to the first and second flexing arm 12*a*, 12*b* respectively, inside the resonant moving structure 12.

The first electrode structure 20 implements one of the electrode functions of actuation and detection. For example, the first and second outer electrodes 20*a*, 20*b* have the function of actuation electrodes, and the second electrode structure 21 implements the other of the electrode functions of actuation and detection. In the example, the first and second inner electrodes 21*a*, 21*b* have the function of detection electrodes.

The aforesaid first and second inner electrodes 21*a*, 21*b* are positioned inside the window 15 between the respective first or second flexing arm 12*a*, 12*b* and a respective one of the first and second pair of attachments 18*a*, 18*c* and 18*b*, 18*d*.

The first and second outer electrode 20*a*, 20*b*, and the first and second inner electrode 21*a*, 21*b*, are attached to the substrate 13 of the MEMS resonator 10, being for example coupled integrally to the upper surface of the substrate 13 by respective attachment elements, each of which is, for example, shaped as a column or pillar, positioned for example in a central position relative to their extension in the horizontal plane xy.

In FIG. 3, the attachment elements of the aforesaid outer electrodes 20*a*, 20*b* and inner electrodes 21*a*, 21*b* are indicated by 20*a*', 20*b*' and 21*a*', 21*b*' respectively. The extension of these attachment elements is shown purely by way of example, and may, in particular, be smaller along the second horizontal axis y. It should be pointed out that these attachment elements are positioned near the attachment arrangement 18, at a distance therefrom along the first horizontal axis x which may be suitably minimized according to the method of production (typically a lithographic process) of the MEMS resonator 10.

Advantageously, because of the smaller distance separating the attachment points of the stator (fixed) and rotor (moving) electrodes, there is very little relative deformation between the stator and rotor electrodes caused by external interference effects (such as temperature variations, due to soldering operations for example, variations in humidity, or bending or other kinds of deformation), resulting in better frequency stability of the MEMS resonator 10.

In particular, it may be demonstrated that, in the described structure, there is only a second-order effect of variation in the value of the resonance frequency in the presence of the aforesaid external interference effects.

Figure 4A:
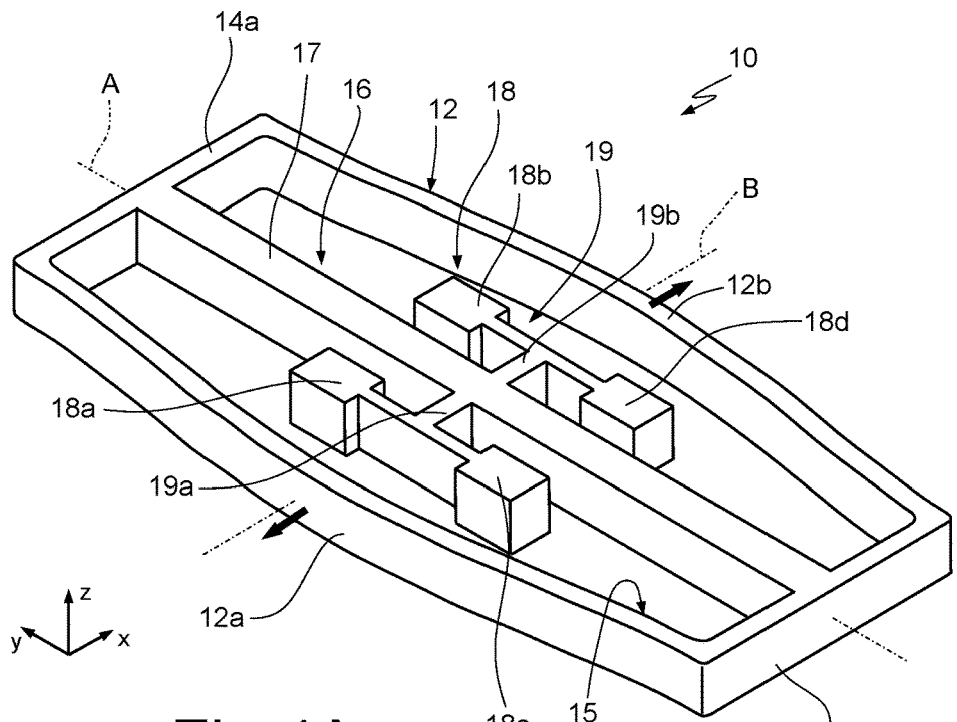
FIG. 4A is a perspective view of a portion of the MEMS resonator of FIG. 3 subjected to deformation.
Figure 4B:
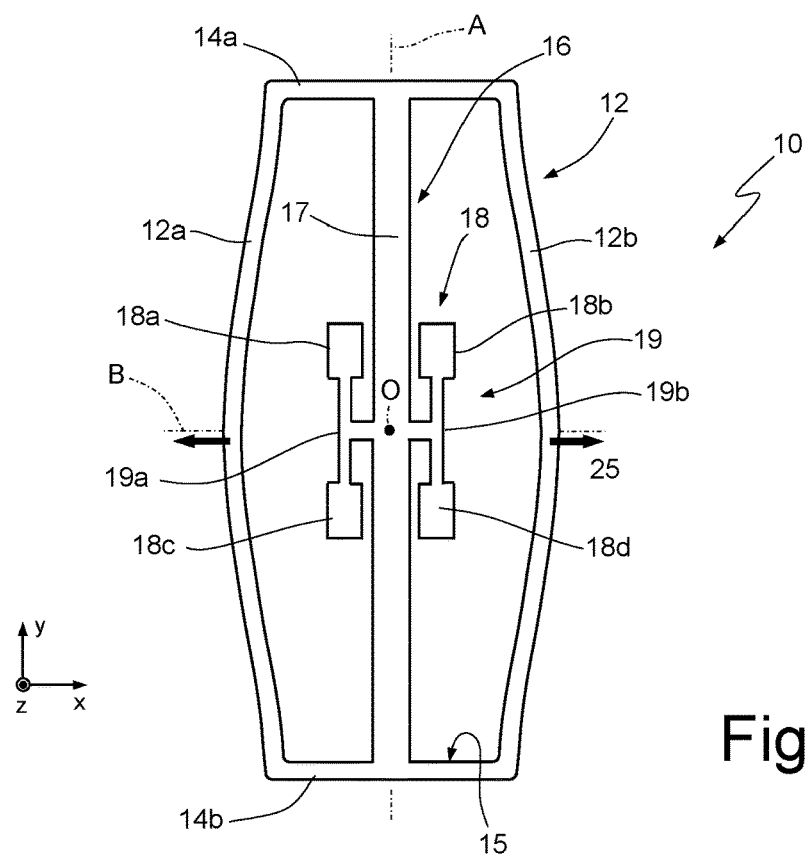
FIG. 4B is a top view of the portion of the MEMS resonator of FIG. 4A.

In use, and as also shown in FIGS. 4A and 4B, the application of a suitable bias voltage between the outer electrodes 20*a*, 20*b* (or between the inner electrodes 21*a*, 21*b*) and the resonant moving structure 12 causes a movement in antiphase of deformation by flexion of the corresponding first and second flexing arm 12*a*, 12*b* in opposite directions along the first horizontal axis x (as indicated by the arrows), at the resonance frequency. In particular, the deformation of the flexing arms 12*a*, 12*b* is maximal at their central portions and minimal at the end portions which are joined by the transverse joining elements 14*a*, 14*b*.

The consequent movement of the first and second flexing arms 12*a*, 12*b* towards and away from the inner electrodes 21*a*, 21*b* (or the outer electrodes 20*a*, 20*b*) causes a variation of the capacitive coupling and the generation of an associated electrical signal, also at the resonance frequency, which may then be detected and processed in a suitable way by an electronic circuit (not shown here) associated with the MEMS resonator 10.

During the resonant movement of the first and second flexing arms 12*a*, 12*b*, the suspension structure 16, and in particular the corresponding suspension arm 17, remain substantially immobile and integral with the substrate 13.

Figure 5:
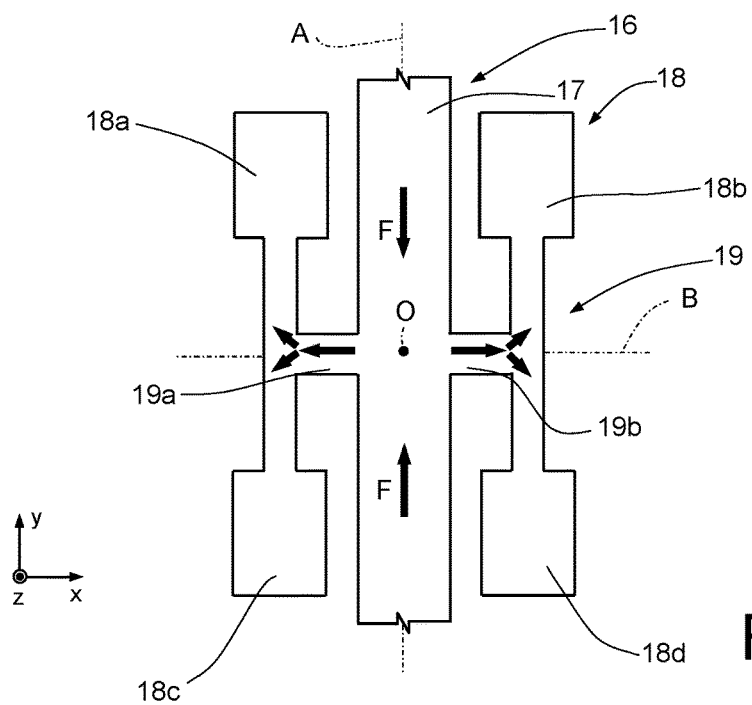
FIG. 5 is an enlarged view of a portion of the MEMS resonator of FIG. 4B, with an indication of the direction of the forces acting.

As shown in detail in FIG. 5, because of the symmetrical fastening conditions relative to the substrate 13 provided by the suspension structure 16, equal and opposite forces F running parallel to the second horizontal axis y towards the geometric center O are generated along the suspension arm 17 as a result of the deformation of the first and second flexing arm 12a, 12b. These forces F are discharged laterally towards the attachments 18 along the first and second connecting elements 19a, 19b, as indicated by the arrows in FIG. 5.

In particular, as a result of the Poisson ratio, the axial contraction of the suspension arm 17 is associated with a transverse contraction (along the first horizontal axis x) in the shank portion of the aforesaid first and second connecting elements 19a, 19b. However, the head portions of the first and second connecting elements 19a, 19b, with the respective shank portions and the respective attachments 18, form a double lever (or double return) system which minimizes the modal displacement near the attachments 18, thus reducing the energy dissipation towards the attachments 18.

In other words, the solution described makes it possible to isolate the deformation movement of the flexing arms 12a, 12b from the attachments 18 towards the substrate 13, which is therefore acted on by substantially zero forces, thereby minimizing energy losses, resulting in a high quality factor Q and a consequent improvement in the performance of the MEMS resonator 10 in terms of power consumption.

Figure 6A:
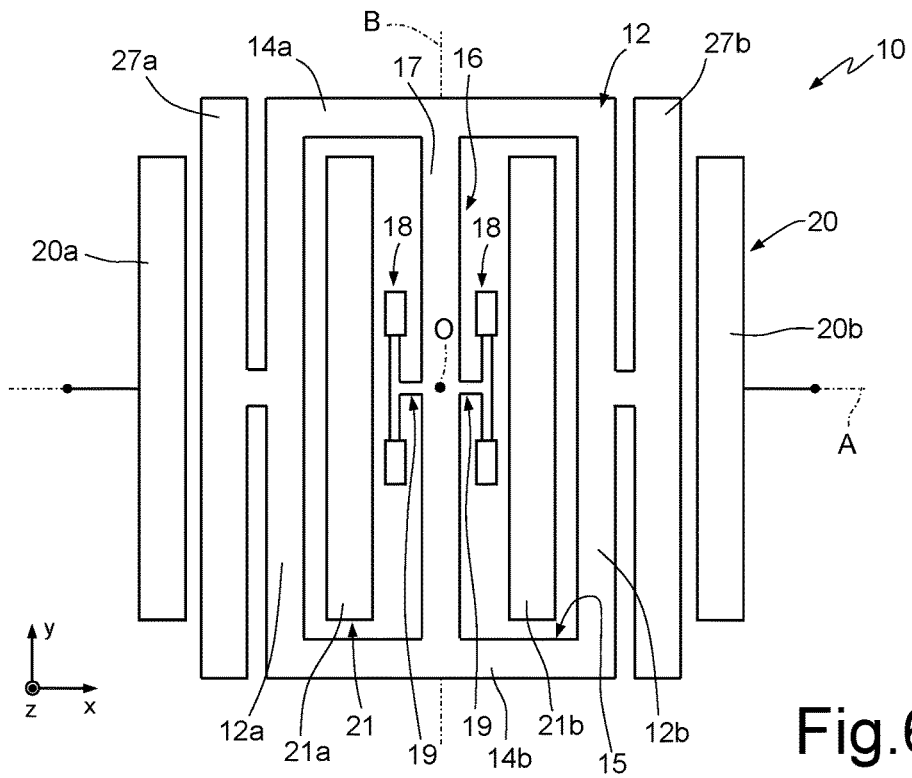
FIG. 6A is a schematic representation, in a top view, of a MEMS resonator according to a further embodiment of the present solution.
Figure 6B:
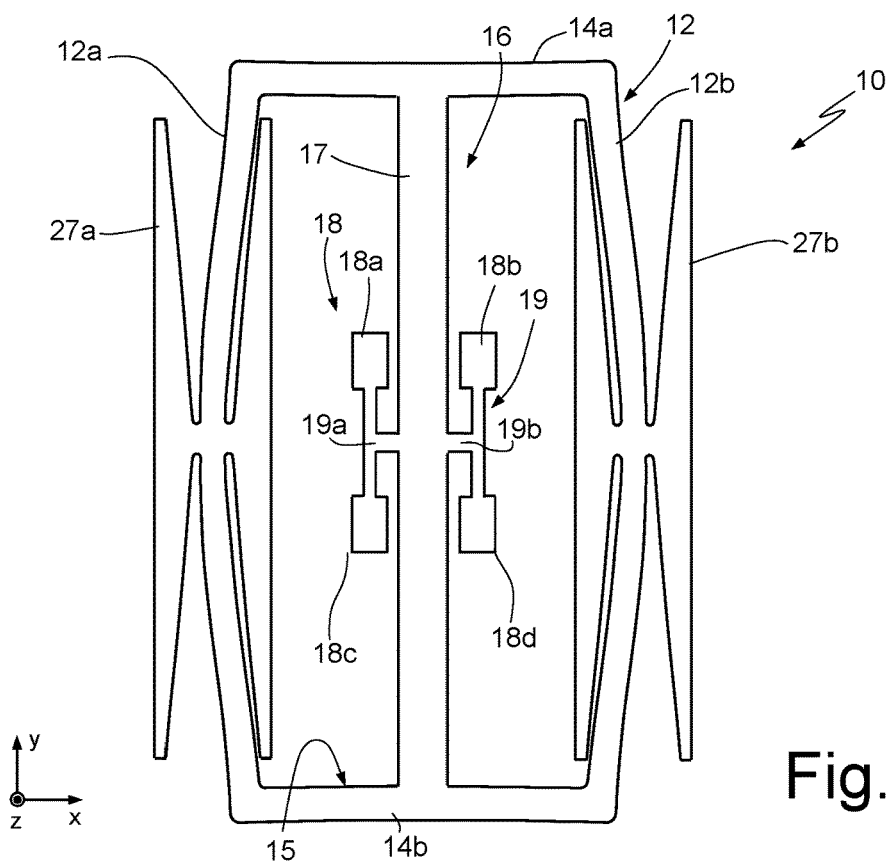
FIG. 6B is a top view of a possible implementation of the MEMS resonator of FIG. 6A.

Referring now to FIG. 6A (showing a schematic representation) and FIG. 6B (showing a possible implementation in greater detail), a further embodiment of the MEMS resonator 10 provides for the presence of slide elements 27a, 27b coupled, respectively, to the first and second arm 12a, 12b of the resonant moving structure 12, in a central portion of each arm.

In one embodiment (see FIG. 6B in particular), each of the aforesaid slide elements 27a, 27b includes a pair of beams having one side facing a respective outer or inner electrode 20, 21 (omitted from the illustration for the sake of clarity), parallel to the second horizontal axis y, each beam being connected to the corresponding central portion of the first or second arm 12a, 12b of the resonant moving structure 12.

These slide elements 27a, 27b are substantially non-deformable with respect to the oscillating vibration mode of the arms 12a, 12b of the resonant moving structure 12, thus maximizing the capacitive coupling with the outer and inner electrodes 20, 21.

In particular, it may be demonstrated that the presence of the aforesaid slide elements 27a, 27b improves the capacitive actuation and reading of the MEMS resonator 10, increasing the factor of merit of the capacitive coupling dC/dx by a factor of two, and consequently reducing the power consumption by a factor of four.

Figure 7A:
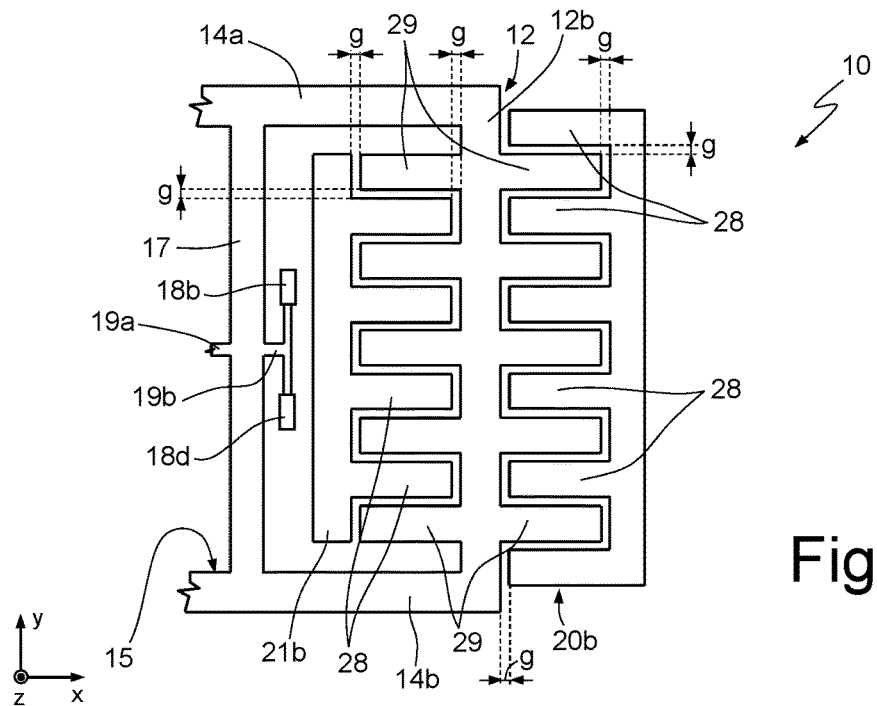
FIG. 7A is a schematic representation, in a top view, of a portion of interdigitated electrodes of a MEMS resonator according to a further embodiment of the present solution.
Figure 7B:
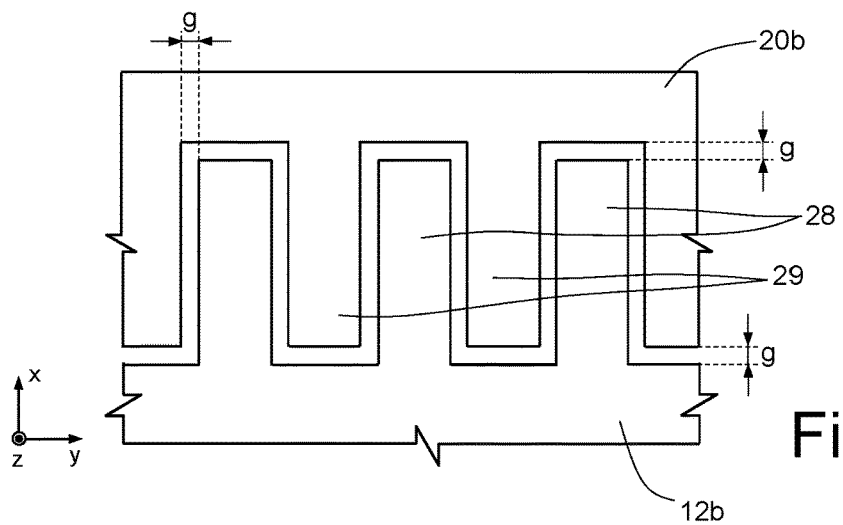
FIG. 7B is an enlarged view of a portion of the MEMS resonator of FIG. 7A.

In a further embodiment of the MEMS resonator 10, shown in FIGS. 7A and 7B, the first electrode structure 20 and/or the second electrode structure 21 includes a plurality of fixed (or stator) electrode portions 28 carried by the respective outer electrodes 20a, 20b or internal electrodes 21a, 21b, interdigitated with respective moving (or rotor) electrode portions 29 carried by the arms 12a, 12b of the resonant moving structure 12. The fixed electrode portions 28 and the moving electrode portions 29 are positioned parallel to one another along the first horizontal axis x. By using a large number of "fingers", high capacitive coupling can be produced between the stator electrodes and the rotor electrodes.

As shown in detail in FIG. 7B, according to a particular aspect of this embodiment, the separation distance (gap) indicated by g along the first horizontal axis x between each fixed electrode portion 28 or moving electrode portion 29 and the facing portion of the respective arm 12a, 12b of the resonant moving structure 12, or of the respective outer electrode 20 or inner electrode 21, is substantially equal to the gap, again indicated by g, along the second horizontal axis y between the same fixed electrode portion 28 and moving electrode portion 29 interdigitated with one another.

The present applicant has demonstrated that this interdigitated configuration of the stator and rotor electrodes enables the non-linearities of actuation to be reduced by as much as 30% compared with conventional solutions, while providing a high factor of merit of the capacitive coupling, dC/dx, with a consequent reduction in power consumption.

In other words, the described solution combines the advantages of conventional solutions using parallel flat plate (or PP, for "parallel plate") electrodes and conventional solutions using interdigitated electrodes (or CF, for "comb fingered").

The advantages of the described solution are evident from the preceding description.

In any case, it must again be pointed out that this solution makes it possible to obtain improved electrical features, particularly as regards the frequency stability and the power consumption.

The MEMS resonator 10 may therefore advantageously replace conventional quartz-based resonating structures in oscillator circuits, in RTC applications for example.

Figure 8:
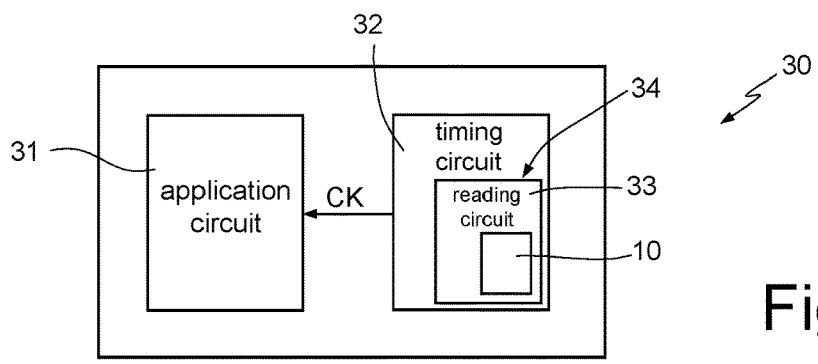
FIG. 8 is a block diagram of an electronic device incorporating the MEMS resonator, according to an embodiment of the present solution.

In this connection, FIG. 8 shows schematically an electronic device 30 comprising an application circuit 31 for executing one or more applications requiring timing by a clock signal ck, and a timing circuit 32 for supplying the clock signal ck to the application circuit 31.

The timing circuit 32 includes the MEMS resonator 10 discussed above with an associated electronic reading circuit 33, which may advantageously be integrated with the MEMS resonator 10 in the same die 34 of semiconductor material.

Finally, the solution described and illustrated herein can evidently be modified and varied without departure from the protective scope of the present disclosure.

In particular, it is possible to provide variant embodiments of the suspension structure 16 of the MEMS resonator 10, which, while not being entirely optimized like the solution described above in FIG. 3 for example, can still provide advantages over the known solutions in terms of the improvement of at least some of the corresponding electrical performance characteristics.

Figure 9:
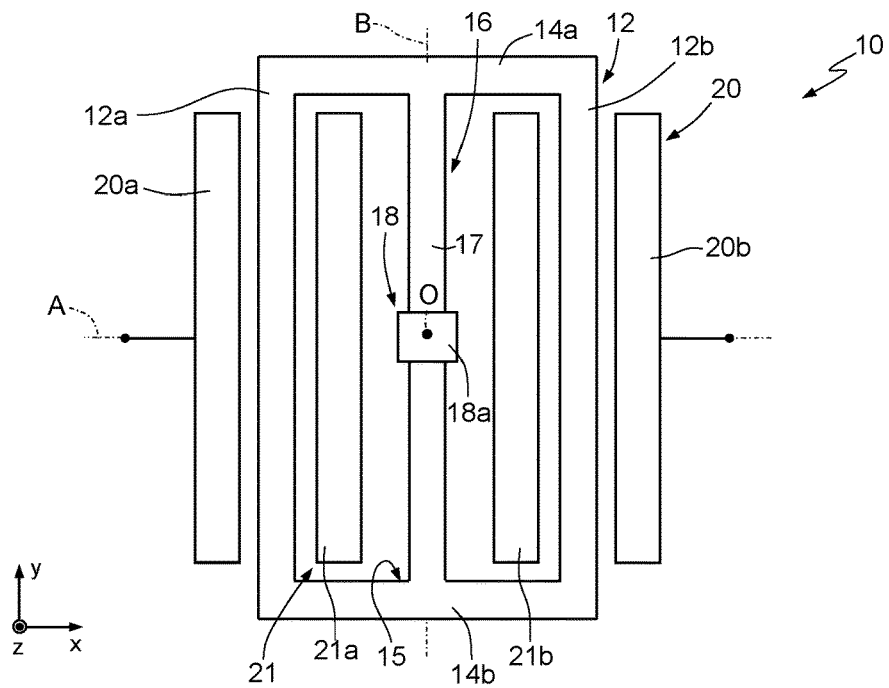
FIGS. 9 and 10 are schematic top views of a MEMS resonator according to variant embodiments of the present solution.

In this connection, FIG. 9 shows a first variant embodiment in which the attachment arrangement 18 includes a single attachment, indicated by 18a, positioned inside the window 15 at the geometric center O of the MEMS resonator 10. In this case, the suspension arm 17 is coupled integrally to this single attachment 18a in a central portion (the suspension structure 16 includes no connecting elements 19 in this case).

As illustrated above, in this case also the MEMS resonator 10 is robust to external interference factors, because of the close arrangement of the attachments of the stator and rotor electrodes.

Although this embodiment is simpler to produce, it is not entirely optimized in terms of energy dissipation towards the substrate 13, since the single attachment 18a is subjected to the axial forces acting on the suspension arm 17.

Figure 10:
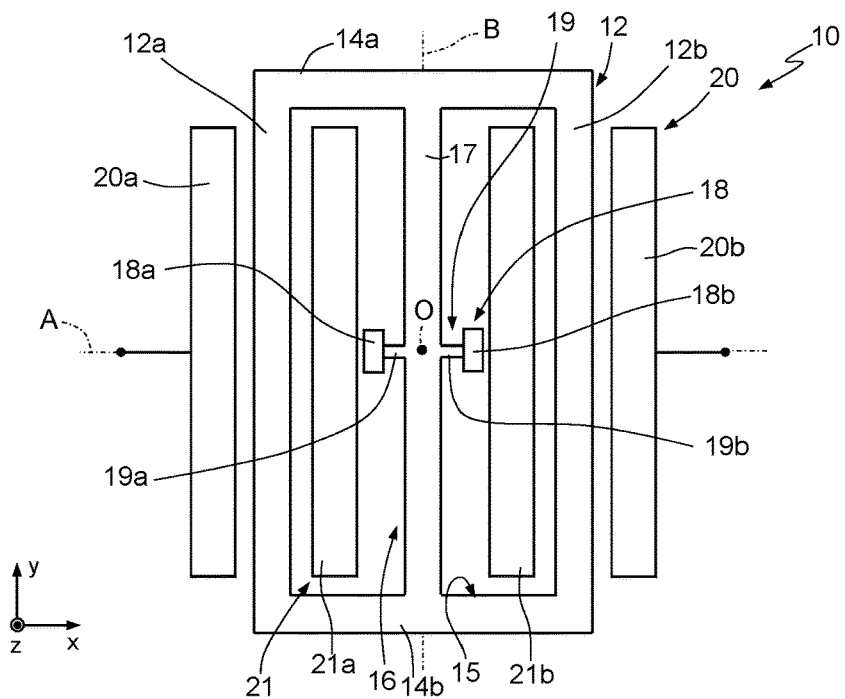

A further variant embodiment, shown in FIG. 10, overcomes this problem at least partially, by providing for the presence of a pair of attachments 18a, 18b positioned on opposite sides of the suspension arm 17, symmetrically with respect to the second axis of symmetry B and in alignment along the first axis of symmetry A. In this case, the suspension arm 17 is coupled to the attachments 18a, 18b by a first and a second connecting element 19a, 19b, which in this case extend linearly along the first horizontal axis x.

This solution has the advantage, in common with the variant discussed with reference to the preceding FIG. 9, of having stator and rotor electrodes attached in close proximity to one another, thereby maximizing the frequency stability of the MEMS resonator 10. Moreover, this variant has the further advantage of having the attachments 18a, 18b displaced laterally from the suspension arm 17.

In this case, the attachments 18a, 18b are therefore subjected to a compressive force along the first horizontal axis x, caused purely by a second-order effect associated with the deformation of the flexing arms 12a, 12b (owing to the Poisson ratio). This variant is therefore more advantageous, in that it has a higher quality factor Q and lower energy dissipation.

It should also be pointed out that the flexing arms 12a, 12b, as well as the suspension arm 17, may be made in a pierced, rather than a solid form, that is to say with a plurality of through holes along their longitudinal extension, for example in order to allow the release of an underlying sacrificial layer by chemical etching.

It should also be noted that the resonant structure described may advantageously be used in various further applications other than the real time clock application to which reference has been made above, for example in high frequency reference oscillators.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A MEMS resonator, comprising:
a substrate;
a moving structure suspended above said substrate and having its main extension in a horizontal plane formed by a first and a second horizontal axis which are orthogonal to one another, the structure comprising a first and a second flexing arm, parallel to one another and extending along the second horizontal axis, said first and second flexing arms being coupled at their respective ends by a first and a second transverse joining element, the first and second transverse joining elements having an extension along the first horizontal axis to forming an internal window with the first and second flexing arms;
a first electrode structure positioned outside said window and capacitively coupled in said horizontal plane to the moving structure;
a second electrode structure positioned inside said window and capacitively coupled in said horizontal plane to the moving structure, one of said first and second electrode structures having the function of causing an oscillatory movement of said first and second flexing arm in opposite directions along said first horizontal axis, at a corresponding resonance frequency, and the other of said first and second electrode structures having the function of detecting said oscillation; and
a suspension structure configured to suspend said moving structure above the substrate, said suspension structure including a suspension arm extending inside said window between said first and second transverse joining elements, and an attachment arrangement coupled to said suspension arm and to said substrate, the attachment arrangement positioned centrally in said window near said second electrode structure.

2. The MEMS resonator according to claim 1, wherein said suspension structure is configured in response to forces associated with the oscillatory movement of said moving structure to provide substantially zero energy dissipation towards said substrate at said attachment arrangement.

3. The MEMS resonator according to claim 2, wherein said suspension structure has a symmetrical shape with respect to a first and a second axis of symmetry, running, respectively, parallel to the first and to the second horizontal axis, and with respect to a geometric center of said microelectromechanical resonator in said horizontal plane.

4. The MEMS resonator according to claim 1, wherein said attachment arrangement comprises a central attachment coupled integrally to a central portion of said suspension arm and to said substrate.

5. The MEMS resonator according to claim 3, wherein said attachment arrangement comprises a first and a second attachment, and wherein said suspension structure further comprises connecting elements, positioned inside said window for connecting said suspension arm to said first and second attachments, said first and second attachments being positioned laterally with respect to said suspension arm in alignment along said first horizontal axis.

6. The MEMS resonator according to claim 3, wherein said suspension structure comprises a first and a second T-shaped connecting element, each T-shaped connecting element extending from a central portion of said suspension arm, and a first and a second pair of attachments positioned laterally with respect to said suspension arm, said first and second T-shaped connecting elements having their respective ends coupled to the attachments of the first and second pair of attachments, respectively.

7. The MEMS resonator according to claim 6, wherein said first and second T-shaped connecting connection elements form a respective double lever coupling between said suspension arm and the respective first and second pair of attachments.

8. The MEMS resonator according to claim 1, wherein said attachment arrangement is positioned at a minimum separation distance from respective attachment elements of inner electrodes of said second electrode structure and from respective attachment elements of outer electrodes of said first electrode structure, near a geometric center of said window and of said microelectromechanical resonator in said horizontal plane.

9. The MEMS resonator as claimed in claim 1, further comprising a first and a second slide element coupled, respectively, to the first and the second flexing arm of the moving structure at a central portion of the first and the second flexing arm, the first and second slide elements being substantially non-deformable in the presence of the corresponding oscillatory movement of said first and second flexing arm.

10. The MEMS resonator according to claim 1, wherein one of said first electrode structure and said second electrode structure comprises a plurality of fixed electrode portions interdigitated with respective moving electrode portions carried by the first and second flexing arm of the moving structure, wherein the fixed electrode portions and the moving electrode portions are positioned parallel to one another along said first horizontal axis.

11. The MEMS resonator according to claim 10, wherein there is a separation distance along the first horizontal axis between each fixed electrode portion and each moving electrode portion and a facing portion of one of the respective first and second flexing arm of the moving structure, or of one of the respective first and second electrode structures, is substantially equal to a separation distance along the second horizontal axis between the fixed electrode portion and moving electrode portion interdigitated with one another.

12. The MEMS resonator according to claim 1, wherein said moving structure is configured to oscillate in said horizontal plane substantially parallel to an upper surface of said substrate, and wherein said first and second flexing arms are configured to be actuated in an antiphase movement of by one of said first and second electrode structure.

13. The MEMS resonator according to claim 1, wherein said resonance frequency is associated with a frequency for a real time clock.

14. The MEMS resonator of claim 13 further comprising a processing stage for generating a timing signal for a real time clock as a function of said oscillating frequency.

15. An electronic device, comprising:
  a timing circuit is configured to generate a clock signal based on oscillatory movement of first and second flexing arms of a MEMS resonator, the MEMS resonator including:
    a substrate;
    a moving structure suspended above said substrate and having its main extension in a horizontal plane formed by a first and a second horizontal axis which are orthogonal to one another, the structure comprising a first and a second flexing arm, parallel to one another and extending along the second horizontal axis, said first and second flexing arms being coupled at their respective ends by a first and a second transverse joining element, the first and second transverse joining elements having an extension along the first horizontal axis to forming an internal window with the first and second flexing arms;
    a first electrode structure positioned outside said window and capacitively coupled in said horizontal plane to the moving structure;
    a second electrode structure positioned inside said window and capacitively coupled in said horizontal plane to the moving structure, one of said first and second electrode structures having the function of causing an oscillatory movement of said first and second flexing arm in opposite directions along said first horizontal axis, at a corresponding resonance frequency, and the other of said first and second electrode structures having the function of detecting said oscillation; and
    a suspension structure configured to suspend said moving structure above the substrate, said suspension structure including a suspension arm extending inside said window between said first and second transverse joining elements, and an attachment arrangement coupled to said suspension arm and to said substrate, the attachment arrangement positioned centrally in said window near said second electrode structure; and
  an application circuit coupled to the timing circuit to receive said clock signal, the application circuit configured to execute one or more applications utilizing timing based on the clock signal.

16. The electronic device of claim 15, wherein the timing circuit further comprises a reading circuit coupled to the MEMS resonator, the reading circuit and MEMS resonator being integrated in a same die of semiconductor material.

17. The electronic device of claim 15, wherein the suspension structure comprises a first and a second T-shaped connecting element, each connecting element having a shank portion extending along the first horizontal axis and being connected to a central portion of the suspension arm, and including a head portion extending along the second horizontal axis transversely to the shank portion and connected at opposing ends of the head portion to a respective pair of attachments coupled to the substrate.

18. A method, comprising:
  suspending a moving structure above a substrate, the moving structure extending in a horizontal plane including first and second orthogonal horizontal axes and including first and second flexing arms that are parallel to the second horizontal axis and are coupled at respective ends of each of the first and second flexing arms by first and second transverse joining elements that are parallel to the first horizontal axis to forming an internal window with the first and second flexing arms, and including a suspension arm extending inside said window between said first and second transverse joining elements; and
  coupling the suspended moving structure to the substrate through an attachment arrangement coupled to said suspension arm, the attachment arrangement positioned centrally in said window near.

19. The method of claim 18 further comprising capacitively coupling a driving signal the first and second flexing arms to cause deformation and oscillation of the first and second flexing arms in opposite directions along an axis parallel to the first horizontal axis.

20. The method of claim 19 further comprising sensing variations in capacitive coupling between the oscillating first and second flexing arms a detection electrode attached to the substrate.

* * * * *